(12) United States Patent
Karhade et al.

(10) Patent No.: US 10,461,003 B2
(45) Date of Patent: Oct. 29, 2019

(54) ELECTRONIC PACKAGE THAT INCLUDES MULTIPLE SUPPORTS

(71) Applicant: Intel Corporation, Santa Clara, CA (US)

(72) Inventors: Omkar Karhade, Chandler, AZ (US); Kedar Dhane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/778,387

(22) PCT Filed: Nov. 11, 2016

(86) PCT No.: PCT/US2016/061471
§ 371 (c)(1),
(2) Date: May 23, 2018

(87) PCT Pub. No.: WO2017/105690
PCT Pub. Date: Jun. 22, 2017

(65) Prior Publication Data
US 2018/0358274 A1  Dec. 13, 2018

Related U.S. Application Data

(63) Continuation of application No. 14/967,993, filed on Dec. 14, 2015, now abandoned.

(51) Int. Cl.
*H01L 23/04* (2006.01)
*H01L 23/16* (2006.01)
*H01L 23/00* (2006.01)

(52) U.S. Cl.
CPC ............ *H01L 23/16* (2013.01); *H01L 23/562* (2013.01); *H01L 24/13* (2013.01); *H01L 24/16* (2013.01);
(Continued)

(58) Field of Classification Search
USPC .......................................... 257/730
See application file for complete search history.

(56) References Cited

U.S. PATENT DOCUMENTS 3,612,955 A   10/1971  Butherus et al.
3,783,499 A    1/1974  Hughes, Jr. et al.
(Continued)

FOREIGN PATENT DOCUMENTS

| CN | 108352362 | 7/2018 |
| JP | 2008147596 A | 6/2008 |
| WO | WO-2017105690 A1 | 6/2017 |

OTHER PUBLICATIONS

"U.S. Appl. No. 14/967,983, Response filed Sep. 2, 2016 to Non Final Office Action dated Aug. 5, 2016", 13 pgs.
(Continued)

*Primary Examiner* — Niki H Nguyen
(74) *Attorney, Agent, or Firm* — Schwegman Lundberg & Woessner, P.A.

(57) ABSTRACT

An electronic package that includes a substrate; a die attached to the substrate; an underfill positioned between the die and the substrate due to capillary action; a first support adjacent to the die and attached to the substrate; and a second support mounted on the first support, wherein the second support is closer to the die than the first support, wherein first support surrounds the die and the second support surrounds the die, and wherein the second support is a different material than the first support. The die may be flip chip bonded to the substrate and the underfill may secure the die to the substrate. The first support may be attached to the substrate using an adhesive and the second support may be attached to the first support using an adhesive.

16 Claims, 4 Drawing Sheets

(52) U.S. Cl.
CPC ............. *H01L 24/32* (2013.01); *H01L 24/73* (2013.01); *H01L 24/92* (2013.01); *H01L 2224/131* (2013.01); *H01L 2224/16227* (2013.01); *H01L 2224/32225* (2013.01); *H01L 2224/73204* (2013.01); *H01L 2224/92125* (2013.01); *H01L 2924/00014* (2013.01); *H01L 2924/014* (2013.01); *H01L 2924/3511* (2013.01); *H01L 2924/3512* (2013.01)

(56) References Cited

U.S. PATENT DOCUMENTS

| | | | |
|---|---|---|---|
| 3,855,693 | A | 12/1974 | Umbaugh |
| 4,661,886 | A | 4/1987 | Nelson |
| 5,447,886 | A | 9/1995 | Rai |
| 5,561,265 | A | 10/1996 | Livshits et al. |
| 5,986,459 | A | 11/1999 | Fukaya et al. |
| 6,011,304 | A | 1/2000 | Mertol |
| 6,117,352 | A | 9/2000 | Weaver et al. |
| 6,142,361 | A | 11/2000 | Downes, Jr. et al. |
| 6,429,384 | B1 | 8/2002 | Downes, Jr. et al. |
| 6,472,762 | B1 | 10/2002 | Kutlu |
| 6,972,486 | B2 | 12/2005 | Lam et al. |
| 7,015,577 | B2 | 3/2006 | Wang |
| 7,145,179 | B2 | 12/2006 | Petroski |
| 7,397,111 | B2 | 7/2008 | Jerebic et al. |
| 7,482,688 | B2 | 1/2009 | Glowinke |
| 7,728,440 | B2 | 6/2010 | Honda |
| 7,968,999 | B2 | 6/2011 | Celik et al. |
| 8,004,096 | B2 | 8/2011 | Fukuzono |
| 8,022,534 | B2 | 9/2011 | Wang et al. |
| 8,034,661 | B2 | 10/2011 | Lin et al. |
| 8,129,828 | B2 | 3/2012 | Maeda |
| 8,324,718 | B2 | 12/2012 | Honda |
| 8,472,195 | B2 | 6/2013 | Nakanishi et al. |
| 8,912,648 | B2 | 12/2014 | Lin et al. |
| 8,940,550 | B1 | 1/2015 | Fasano et al. |
| 9,202,769 | B2 | 12/2015 | Lin et al. |
| 2002/0066955 | A1 | 6/2002 | Shibamoto et al. |
| 2003/0146503 | A1 | 8/2003 | Khan et al. |
| 2003/0176020 | A1 | 9/2003 | Tsao et al. |
| 2004/0036162 | A1 | 2/2004 | Chuang et al. |
| 2004/0150118 | A1 | 8/2004 | Honda |
| 2004/0195701 | A1 | 10/2004 | Attarwala |
| 2005/0161816 | A1 | 7/2005 | Kanda |
| 2006/0084254 | A1 | 4/2006 | Attarwala |
| 2007/0069368 | A1* | 3/2007 | Archer, III .......... H01L 21/4871 257/706 |
| 2007/0145571 | A1 | 6/2007 | Lee et al. |
| 2008/0001308 | A1* | 1/2008 | Chen ..................... H01L 23/16 257/778 |
| 2008/0054490 | A1* | 3/2008 | McLellan ............... H01L 24/97 257/778 |
| 2008/0211088 | A1 | 9/2008 | Sato |
| 2009/0218680 | A1 | 9/2009 | Celik et al. |
| 2009/0250806 | A1 | 10/2009 | Wang et al. |
| 2009/0289338 | A1 | 11/2009 | Hu et al. |
| 2009/0289339 | A1 | 11/2009 | Hu et al. |
| 2010/0230797 | A1 | 9/2010 | Honda |
| 2011/0121449 | A1 | 5/2011 | Lin et al. |
| 2011/0169170 | A1* | 7/2011 | Baba ................. H01L 23/49822 257/774 |
| 2012/0001325 | A1 | 1/2012 | Lin et al. |
| 2012/0014068 | A1 | 1/2012 | Nakanishi et al. |
| 2012/0056336 | A1* | 3/2012 | Ou ........................ H01L 23/562 257/778 |
| 2014/0061893 | A1 | 3/2014 | Saeidi et al. |
| 2015/0021754 | A1* | 1/2015 | Lin ..................... H01L 23/5389 257/712 |
| 2015/0145126 | A1 | 5/2015 | Lin et al. |
| 2015/0187679 | A1 | 7/2015 | Ho et al. |
| 2015/0303163 | A1 | 10/2015 | Chuang et al. |
| 2016/0073493 | A1 | 3/2016 | Leung et al. |
| 2016/0093795 | A1 | 3/2016 | Arai et al. |
| 2016/0172323 | A1 | 6/2016 | Tomita et al. |
| 2016/0192524 | A1* | 6/2016 | Ruben ..................... H05K 3/38 607/116 |
| 2017/0170087 | A1 | 6/2017 | Karhade et al. |

OTHER PUBLICATIONS

"U.S. Appl. No. 14/967,993, Advisory Action dated Jul. 5, 2017", 3 pgs.

"U.S. Appl. No. 14/967,993, Examiner Interview Summary dated Mar. 3, 2017", 2 pgs.

"U.S. Appl. No. 14/967,993, Examiner Interview Summary dated Aug. 31, 2016", 3 pgs.

"U.S. Appl. No. 14/967,993, Examiner Interview Summary dated Nov. 15, 2016", 3 pgs.

"U.S. Appl. No. 14/967,993, Final Office Action dated Apr. 28, 2017", 35 pgs.

"U.S. Appl. No. 14/967,993, Non Final Office Action dated Aug. 5, 2016", 36 pgs.

"U.S. Appl. No. 14/967,993, filed Jun. 21, 2017 to Final Office Action dated Apr. 28, 2017", 8 pgs.

"International Application Serial No. PCT/US2016/061471, International Search Report dated Feb. 27, 2017", 4 pgs.

"International Application Serial No. PCT/US2016/061471, Written Opinion dated Feb. 27, 2017", 8 pgs.

Lee, H,"", KR 2003046795A, English abstract, (2003), 3 pgs.

U.S. Appl. No. 14/967,993, filed Dec. 14, 2015, Electronic Package That Includes Multiple Supports.

\* cited by examiner

ELECTRONIC PACKAGE THAT INCLUDES MULTIPLE SUPPORTS

PRIORITY CLAIM

This patent application is a U.S. National Stage Filing under 35 U.S.C. 371 from International Application No. PCT/US2016/061471, filed on Nov. 11, 2016, and published as WO 2017/105690, which claims the benefit of priority to U.S. application Ser. No. 14/967,993, filed Dec. 14, 2015, each of which are incorporated by reference herein in their entirety.

TECHNICAL FIELD

Embodiments described herein generally relate to an electronic package and an electronic package that includes multiple supports.

BACKGROUND

Ultrathin electronic packages typically require stiffening in order to reduce temperature-related warpage during ball attach processes and/or solder mounting processes. One common technique for reducing temperature-related warpage is to attach a stiffener to a substrate around a die that is on the substrate.

A thicker stiffener provides better warpage control. However, a thicker stiffener also increases stress on the die making it prone to cracking. A thicker stiffener also makes it more difficult to fabricate the electronic packages that include such stiffeners. This is especially true where fabrication processes utilize tools which come close to the substrate during high speed manufacturing operations (e.g., underfill processes).

Another problem with conventional solutions relating to the temperature-related warpage of electronic packages is many solutions might improve temperature-related warpage at either lower temperatures or high temperatures, but do not improve temperature-related at both low and high temperature. Low temperature warpage reduction is needed for post-die attach processes since the electronic package tends to warp after the electronic package is cooled down after attaching the die to a substrate. In addition, high temperature warpage reduction is typically needed during solder mounting processes where the electronic package is attached to a panel (e.g., a printed circuit board) such that there are no openings or shorts formed when the electronic package is attached to the panel.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The electronic packages described herein may provide a potential solution for reducing temperature-related warpage within the electronic package that may occur due to exposing the electronic package to different temperatures. The electronic packages utilize two supports to help mitigate the effects of temperature-related warpage within the electronic package.

In some forms, a first stiffener engages a substrate where a die is mounted. This first support may be relatively thin so that it does not interfere with various manufacturing processes (e.g., underfill dispensing). The first support may be designed with a relatively high coefficient of thermal expansion to improve low temperature warpage.

Improving low temperature warpage may promote the manufacturability of the electronic package, especially after the die is attached to the substrate. The lower thickness of the first support may also reduce stress on the die which may otherwise cause the die to crack during fabrication (e.g., especially during testing of the electronic package).

In some forms, the second support may be attached to the first support after testing the electronic package. The second support may have a lower co-efficient of thermal expansion in order to reduce high temperature warpage of the electronic package. In addition, the geometry of the second support may be optimized to further reduce high temperature warpage of the electronic package.

Figure 1:
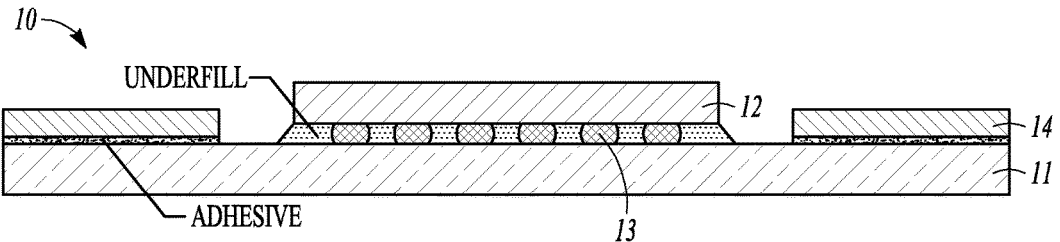
FIG. 1 is a schematic side view of an example electronic package after a first stiffener has been applied to a substrate.
Figure 2:
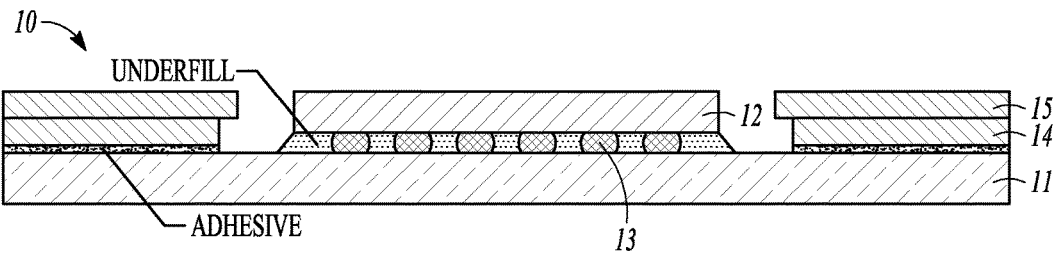
FIG. 2 is a schematic side view similar to FIG. 1 where a second stiffener has been added to the electronic package of FIG. 1.

FIG. 1 is a schematic side view of an example electronic package 10 after a first stiffener 14 has been applied to a substrate 11. FIG. 2 is a schematic side view similar to FIG. 1 where a second stiffener 15 has been added to the electronic package 10 of FIG. 1.

The electronic package 10 includes a substrate 11 and a die 12 attached to the substrate 11 (e.g., by using solder balls 13). In some forms, an underfill (not shown) may be positioned between the die 12 and the substrate 11. The underfill may be inserted between the die 12 and the substrate 11 using capillary action (among other techniques).

A first support 14 is adjacent to the die 12 and attached to the substrate 11. A second support 15 is mounted on the first support 14. In some forms, the second support 15 may be closer to the die 12 than the first support 14.

As examples, the second support 15 may be between 0.1 mm to 4.0 mm from the die 12. In addition, the first support 14 may be between 2 mm to 4.0 mm from the die 12.

The die 12 may be flip-chip bonded to the substrate 11. It should be noted that the manner in which the die 12 is attached to the substrate 11 will depend in part on manufacturing considerations as well as the type of die 12 that is included in the electronic package 10 (among other factors).

In some forms, the underfill may secure the die 12 to the substrate 11. The type of underfill that is included in the electronic package 10 will depend in part on manufacturing considerations associated with fabricating the electronic package 10 (among other factors).

The first support 14 may be attached to the substrate 11 using an adhesive (not shown). It should be noted that a variety of different types of adhesive may be utilized to attach the first support 14 to the substrate 11. In addition, other attachment mechanisms besides adhesives may be used to attach the first support 14 to the substrate 11.

In the example forms of the electronic package 10 that are illustrated in FIGS. 1-4, the first support 14 and the second support 15 have a substantially uniform cross-section. It should be noted that the first and second supports 14-15 may have changing cross-sections (i.e., differing widths and/or thicknesses) depending on where the higher stress areas are projected to be located on the electronic package 10. Therefore, one or both, of the first support 14 and the second support 15 may have a changing cross-section.

Figure 3:
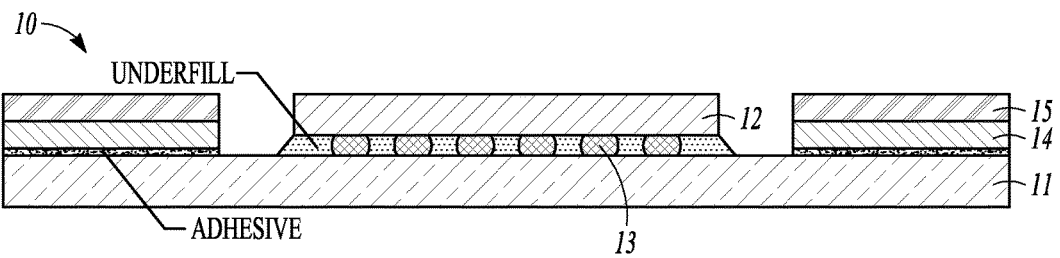
FIG. 3 is a schematic side view similar to FIG. 1 where a second stiffener has been added to the electronic package of FIG. 1.
Figure 4:
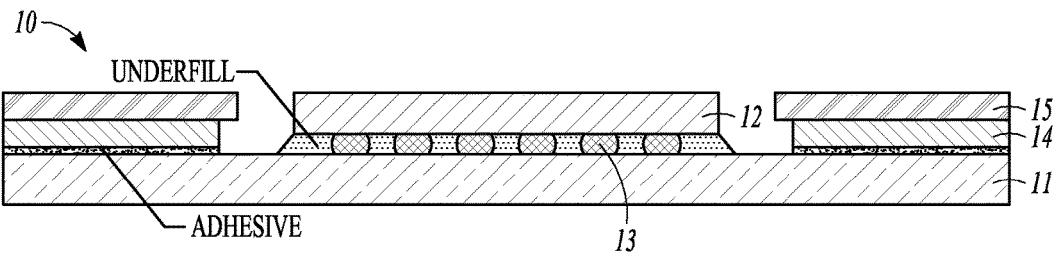
FIG. 4 is a schematic side view similar to FIG. 1 where a second stiffener has been added to the electronic package of FIG. 1.

As shown in FIGS. 3 and 4, the first support 14 may be a different material than the second support 15. The types of materials that are chosen for the first support 14 and the second support 15 will depend in part on the projected stresses that may exist within the electronic package 10. In some forms, the first and second supports 14, 15 may both be formed of the same type of stainless steel (e.g., type 304 stainless steel) or different types of stainless steel. In addition, the relative sizes of the first support 14 and the second support 15 will also depend in part on the projected stresses that may exist within the electronic package 10 (compare, for example, FIG. 3 with FIGS. 2 and 4).

Figure 5:
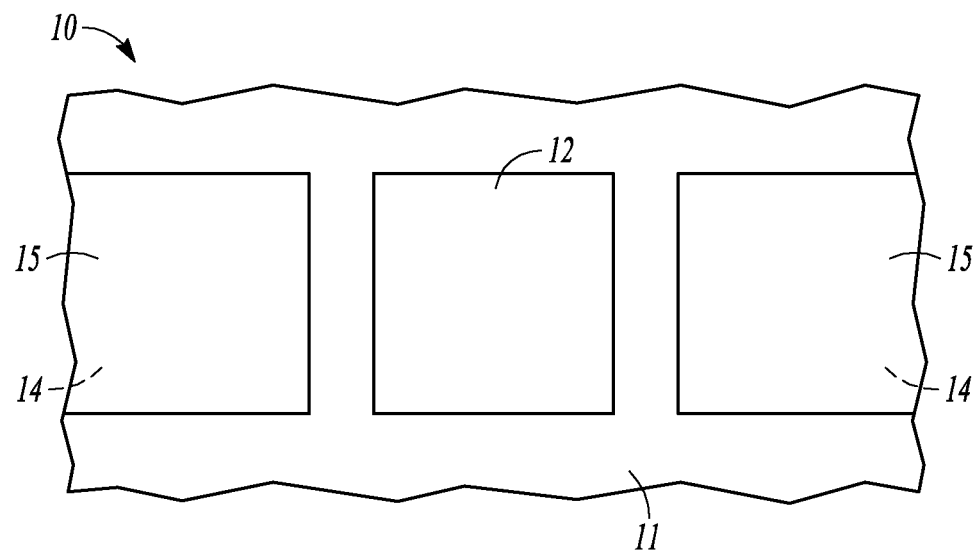
FIG. 5 is a schematic top view of an example electronic package.
Figure 6:
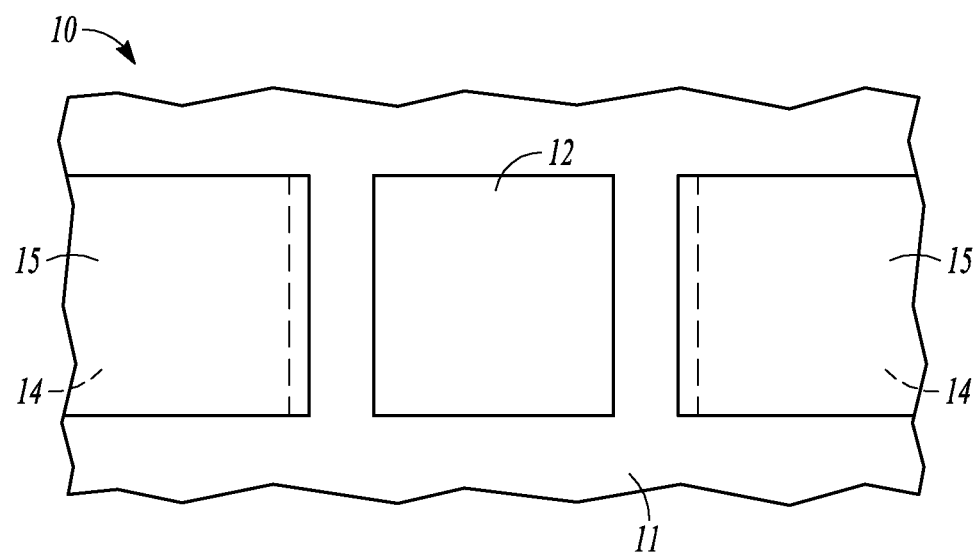
FIG. 6 is a schematic top view similar to FIG. 5 illustrating another example electronic package.

FIG. 5 is a schematic top view of the example electronic package 10 shown in FIG. 3. FIG. 6 is a schematic top view similar to FIG. 5 illustrating the example electronic packages 10 shown in FIGS. 2 and 4.

In the example forms of the electronic packages 10 shown in FIGS. 5 and 6, the first and second supports 14, 15 are positioned on opposing sides of the die 12. In other forms, the first and second supports 14, 15 may be on one, some, or all sides of the die 12 depending on the projected stresses that are projected to exist within the electronic package 10.

Figure 7:
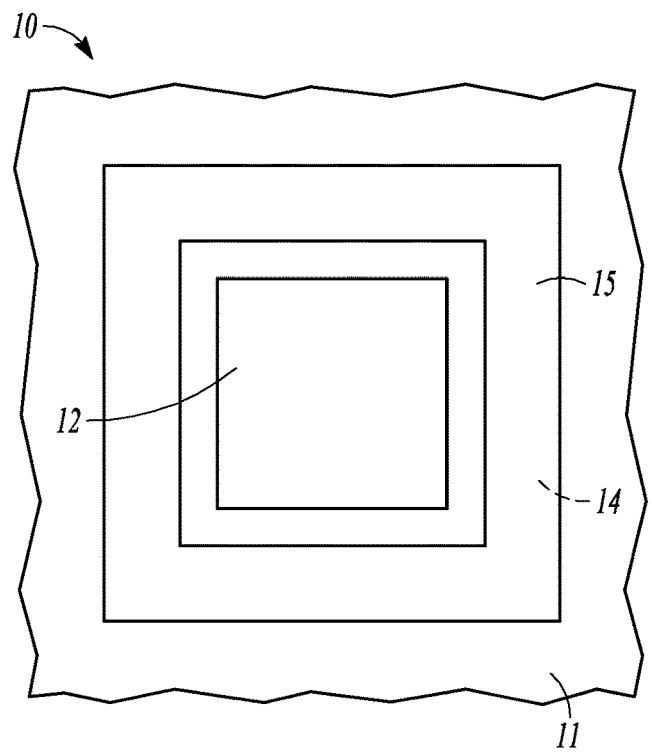
FIG. 7 is a schematic top view illustrating another example electronic package where the electronic package includes window-frame first and second supports.

FIG. 7 is a schematic top view illustrating the example electronic package 10 of FIG. 3. The electronic package 10 includes window-frame like first and second supports 14, 15.

Figure 8:
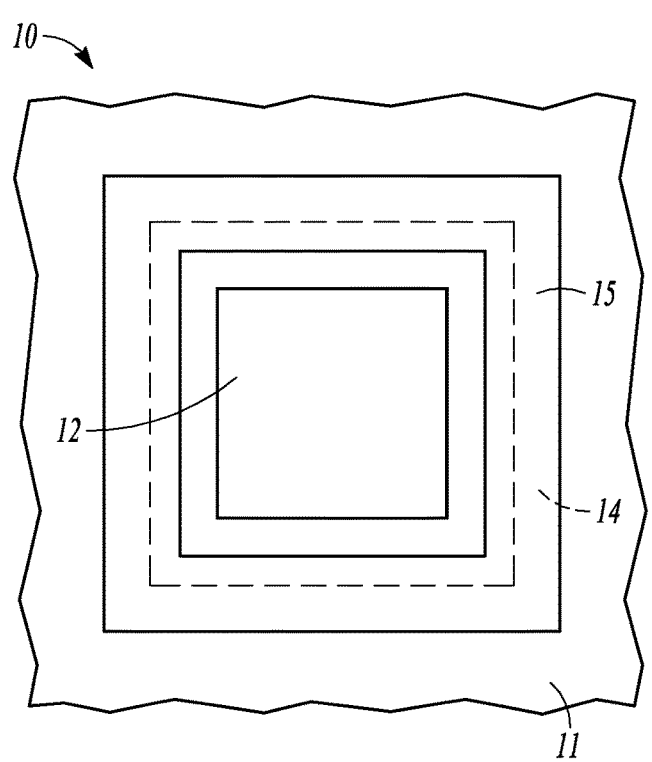
FIG. 8 is a schematic top view similar to FIG. 7 illustrating another example electronic package that includes window-frame first and second supports.

FIG. 8 is a schematic top view similar to FIG. 7 illustrating the example electronic package 10 shown in FIGS. 2 and 4. The electronic package 10 also includes window-frame like first and second supports 14, 15.

In the example electronic package 10 shown in FIGS. 7 and 8, the first support 14 surrounds the die 12. In addition, the second support 15 surrounds the die 12. It should be noted that one, or both, of the first and second supports 14, 15 may surround the die 12.

In some forms, the second support 15 is attached to the first support using an adhesive (not shown). The type of adhesive that is used to attach the second support 15 to the first support 14 will depend in part on the manufacturing considerations that are associated with fabricating the electronic package 10 (among other factors).

In some forms, the first support 14 may be magnetically bonded to the second support 15. In addition, the second support 15 may be attached to the first support 14 in any manner that is known now, or discovered in the future.

As discussed above, FIGS. 3 and 7 show where the first support 14 and the second support 15 are the same size. It should be noted that, as discussed above, the first support 14 and the second support 15 may be different sizes. In some forms, the second support 15 may be thicker than the first support 14. The relative size and thicknesses of the first support 14 and the second support 15 will depend on the projected stresses that may exist in the electronic package 10 (among other factors).

As an example, the first support 14 may have a thickness between 50 to 150 microns. In addition, the first support 14 may have a width between 1 mm to 4 mm. As noted above, the thickness and width of the first support 14 may change at different parts of the first support 14.

As an example, the second support 15 may have a thickness between 50 to 150 microns. In addition, the second support 15 may have a width between 1 mm to 4 mm. As noted above, the thickness and width of the second support 15 may change at different parts of the second support 15.

As an example, the substrate 11 may be a coreless substrate. It should be noted that any type of substrate 11 that is known now, or discovered in the future, may be used in the electronic package 10.

The electronic packages 10 described herein may provide an effective high temperature warpage solution when the electronic packages 10 are mounted to panels. In addition, the electronic packages 10 described herein may provide (i) an effective low temperature warpage solution for manufacturing processes that are related to attaching a die to a substrate; and (ii) a reduced risk of die cracking during testing of the electronic package.

Figure 9:
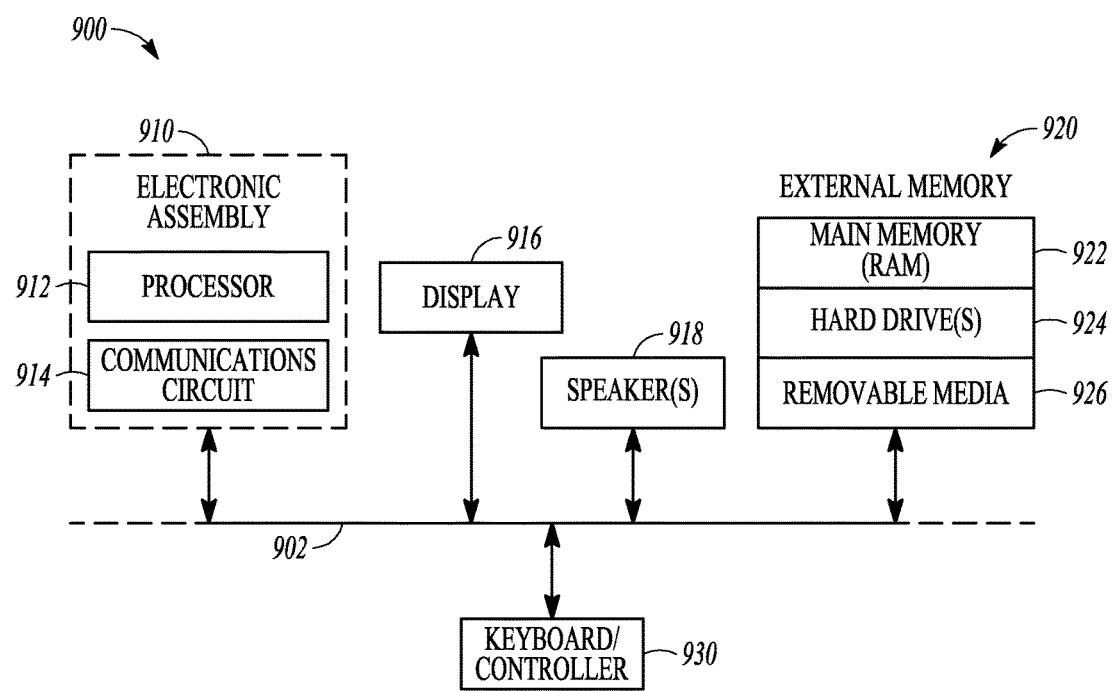
FIG. 9 is a block diagram of an electronic device incorporating at least one electronic package described herein.

An example of an electronic device using the electronic packages that are described herein is included to show an example of a higher level device application for the present invention. FIG. 9 is a block diagram of an electronic device 900 incorporating at least one electronic package 10 described herein. Electronic device 900 is merely one example of an electronic system in which embodiments of the present invention may be used.

Examples of electronic devices 900 include, but are not limited to personal computers, tablet computers, mobile telephones, game devices, MP3 or other digital music players, etc. In this example, electronic device 900 comprises a data processing system that includes a system bus 902 to couple the various components of the system. System bus 902 provides communications links among the various components of the electronic device 900 and can be implemented as a single bus, as a combination of busses, or in any other suitable manner.

An electronic package 910 is coupled to system bus 902. The electronic package 910 can include any circuit or combination of circuits. In one embodiment, the electronic package 910 includes a processor 912 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic package 910 are a custom circuit, an application-specific integrated circuit (ASIC), or the like, such as, for example, one or more circuits (such as a communications circuit 914) for use in wireless devices like mobile telephones, tablet computers, laptop computers, two-way radios, and similar electronic systems. The IC can perform any other type of function.

The electronic device 900 can also include an external memory 920, which in turn can include one or more memory elements suitable to the particular application, such as a main memory 922 in the form of random access memory (RAM), one or more hard drives 924, and/or one or more drives that handle removable media 926 such as compact disks (CD), flash memory cards, digital video disk (DVD), and the like.

The electronic device 900 can also include a display device 916, one or more speakers 918, and a keyboard and/or controller 930, which can include a mouse, trackball, touch screen, voice-recognition device, or any other device that permits a system user to input information into and receive information from the electronic device 900.

To better illustrate the electronic packages disclosed herein, a non-limiting list of embodiments is provided here.

Example 1 includes an electronic package. The electronic package a substrate; a die attached to the substrate; an underfill positioned between the die and the substrate; a first support adjacent to the die and attached to the substrate; and a second support mounted on the first support, wherein the second support is closer to the die than the first support.

Example 2 includes the electronic package of example 1, wherein the die is flip chip bonded to the substrate.

Example 3 includes the electronic package of any one of examples 1 to 2, wherein the underfill secures the die to the substrate.

Example 4 includes the electronic package of any one of examples 1 to 3, wherein first support is attached to the substrate using an adhesive.

Example 5 includes the electronic package of any one of examples 1 to 4, wherein the first support and the second support have a substantially uniform cross to section.

Example 6 includes the electronic package of any one of examples 1 to 5, wherein the first support is a different material than the second support.

Example 7 includes the electronic package of any one of examples 1 to 6, wherein first support surrounds the die.

Example 8 includes the electronic package of any one of examples 1 to 7, wherein the second support surrounds the die.

Example 9 includes the electronic package of any one of examples 1 to 8, wherein the second support is attached to the first support using an adhesive.

Example 10 includes the electronic package of any one of examples 1 to 9, wherein the first support is magnetically bonded to the second support.

Example 11 includes the electronic package of any one of examples 1 to 9, wherein the second support is thicker than the first support.

Example 12 includes the method of any one of examples 1 to 11, wherein the substrate is a coreless substrate.

Example 13 includes an electronic package. The electronic package a substrate; a die attached to the substrate; an underfill positioned between the die and the substrate; a first support adjacent to the die and attached to the substrate; and a second support mounted on the first support, wherein the second support is a different material than the first support.

Example 14 includes the electronic package of example 13, wherein the die is flip chip bonded to the substrate, wherein the underfill secures the die to the substrate, and wherein first support is attached to the substrate using an adhesive.

Example 15 includes the electronic package of any one of examples 13 to 14, wherein first support surrounds the die, and wherein the second support surrounds the die.

Example 16 includes the electronic package of any one of examples 13 to 15, wherein the second support is thicker than the first support.

Example 17 includes an electronic package. The electronic package a substrate; a die attached to the substrate; an underfill positioned between the die and the substrate; a first support adjacent to the die and attached to the substrate; and a second support mounted on the first support, wherein the second support is closer to the die than the first support, wherein first support surrounds the die and the second support surrounds the die, and wherein the second support is a different material than the first support.

Example 18 includes the electronic package of example 17, wherein the die is flip chip bonded to the substrate, and wherein the underfill secures the die to the substrate.

Example 19 includes the electronic package of any one of examples 17 to 18, wherein the first support is attached to the substrate using an adhesive, and wherein the second support is attached to the first support using an adhesive.

Example 20 includes the electronic package of any one of examples 17 to 19, wherein the second support is thicker than the first support.

These and other examples and features of the present electronic device, solder compositions, and related methods will be set forth in part in the detailed description. This overview is intended to provide non-limiting examples of the present subject matter—it is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic package comprising:
a substrate;
a die attached to the substrate, the die including an upper surface;
an underfill positioned between the die and the substrate;
a first support adjacent to the die and attached to the substrate; and
a second support mounted on the first support, the second support including an upper surface, wherein the second support is closer to the die than the first support, wherein the second support is thicker than the first support, wherein the upper surface of the die is aligned with the upper surface of the second support.

2. The electronic package of claim 1, wherein the die is flip chip bonded to the substrate.

3. The electronic package of claim 1, wherein the underfill secures the die to the substrate.

4. The electronic package of claim 1, wherein first support is attached to the substrate using an adhesive.

5. The electronic package of claim 1, wherein the first support is a different material than the second support.

6. The electronic package of claim 1, wherein first support surrounds the die.

7. The electronic package of claim 6, wherein the second support surrounds the die.

8. The electronic package of claim 1, wherein the second support is attached to the first support using an adhesive.

9. The electronic package of claim 1, wherein the first support is magnetically bonded to the second support.

10. The electronic package of claim 1, wherein the substrate is a coreless substrate.

11. An electronic package comprising:
a substrate;
a die attached to the substrate, the die including an upper surface;
an underfill positioned between the die and the substrate;
a first support adjacent to the die and attached to the substrate; and
a second support mounted on the first support, the second support including an upper surface, wherein the second support is a different material than the first support, wherein the second support is thicker than the first support, wherein the upper surface of the die is aligned with the upper surface of the second support.

12. The electronic package of claim 11, wherein the die is flip chip bonded to the substrate, wherein the underfill secures the die to the substrate, and wherein first support is attached to the substrate using an adhesive.

13. The electronic package of claim 11, wherein first support surrounds the die, and wherein the second support surrounds the die.

14. An electronic package comprising:
a substrate;
a die attached to the substrate, the die including an upper surface;
an underfill positioned between the die and the substrate;
a first support adjacent to the die and attached to the substrate; and
a second support mounted on the first support, the second support including an upper surface, wherein the second support is closer to the die than the first support, wherein first support surrounds the die and the second support surrounds the die, and wherein the second support is a different material than the first support, wherein the second support is thicker than the first support, wherein the upper surface of the die is aligned with the upper surface of the second support.

15. The electronic package of claim 14, wherein the die is flip chip bonded to the substrate, and wherein the underfill secures the die to the substrate.

16. The electronic package of claim 14, wherein the first support is attached to the substrate using an adhesive, and wherein the second support is attached to the first support using an adhesive.

* * * * *